(12) United States Patent
Hoshino et al.

(10) Patent No.: US 9,099,283 B2
(45) Date of Patent: Aug. 4, 2015

(54) CHARGED PARTICLE BEAM APPARATUS

(75) Inventors: Yoshinobu Hoshino, Hitachinaka (JP); Shigeru Kawamata, Hitachinaka (JP); Eisaku Oho, Kunitachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 413 days.

(21) Appl. No.: 13/577,833

(22) PCT Filed: Nov. 8, 2010

(86) PCT No.: PCT/JP2010/006531
§ 371 (c)(1), (2), (4) Date: Aug. 8, 2012

(87) PCT Pub. No.: WO2011/099101
PCT Pub. Date: Aug. 18, 2011

(65) Prior Publication Data
US 2012/0307038 A1    Dec. 6, 2012

(30) Foreign Application Priority Data

Feb. 9, 2010  (JP) ................................. 2010-026057

(51) Int. Cl.
*H01J 37/28*   (2006.01)
*H01J 37/244*   (2006.01)

(52) U.S. Cl.
CPC .............. *H01J 37/28* (2013.01); *H01J 37/244* (2013.01); *H01J 2237/223* (2013.01); *H01J 2237/24495* (2013.01); *H01J 2237/2809* (2013.01)

(58) Field of Classification Search
None
See application file for complete search history.

(56) References Cited

U.S. PATENT DOCUMENTS

| | | | | |
|---|---|---|---|---|
| 4,099,054 | A * | 7/1978 | Okumura et al. | 250/306 |
| 4,783,840 | A * | 11/1988 | Song | 382/261 |
| 5,142,147 | A * | 8/1992 | Kawamata et al. | 250/310 |
| 5,173,776 | A * | 12/1992 | Rigg et al. | 348/673 |
| 5,523,568 | A * | 6/1996 | Ichikawa et al. | 250/310 |
| 6,366,688 | B1 * | 4/2002 | Jun et al. | 382/145 |

(Continued)

FOREIGN PATENT DOCUMENTS

| | | |
|---|---|---|
| JP | 02-236938 | 9/1990 |
| JP | 06-150865 | 5/1994 |

(Continued)

OTHER PUBLICATIONS

International Search Report from International Application No. PCT/JP2010/006531 mailed Dec. 21, 2010.

*Primary Examiner* — Michael Teitelbaum
(74) *Attorney, Agent, or Firm* — Brundidge & Stanger, P.C.

(57) ABSTRACT

A signal processing unit (21) of a charged particle microscope calculates a degradation function (H (s)) of an image, on the basis of detection signals (11) obtained by scanning a charged particle beam (2) at two types of scanning speeds, a scanning speed within the bandwidths of a detector (12) and an amplifying circuit at a subsequent stage of the detector, and another scanning speed exceeding the upper limit of the bandwidths. Then, the signal processing unit creates a one-dimensional correction filter for recovering image quality, from an inverse function ($H^{-1}$ (s)) of the degradation function, and applies the one-dimensional correction filter to the detection signal recorded at the scanning speed exceeding the upper limit of the bandwidths of the detector and the amplifying circuit at a subsequent stage of the detector, or to a two-dimensional image based on the detection signal.

8 Claims, 4 Drawing Sheets

(56) References Cited

U.S. PATENT DOCUMENTS

| | | | |
|---|---|---|---|
| 7,653,224 B2* | 1/2010 | Goto et al. | 382/128 |
| 2003/0111602 A1 | 6/2003 | Sato et al. | |
| 2003/0141451 A1 | 7/2003 | Sato et al. | |
| 2007/0029478 A1 | 2/2007 | Sato et al. | |
| 2007/0194231 A1* | 8/2007 | Nakahira et al. | 250/310 |
| 2008/0251719 A1* | 10/2008 | Nakahira et al. | 250/311 |

FOREIGN PATENT DOCUMENTS

| | | |
|---|---|---|
| JP | 2008-177064 | 7/2008 |
| WO | 03/044821 | 5/2003 |

* cited by examiner

CHARGED PARTICLE BEAM APPARATUS

TECHNICAL FIELD

The present invention is related to a charged particle beam apparatus with which degradation of a detection signal, which occurs due to frequency band restriction of a used amplifier when charged particle beam is scanned at a relatively high speed, is corrected.

BACKGROUND ART

Making use of a charged particle beam apparatus, charged particle beam is scanned on a sample two-dimensionally in the horizontal and vertical directions, a secondary signal ejected from a surface sample region on which charged particle beam comes incident is detected and a surface structure in the surface region is observed as a two-dimensional image by replacing an amount of the secondary signal with a concentration value of the image data for each of the coordinates in the two-dimensional image which are associated with the scan coordinates for the charged particle beam. In this charged particle beam apparatus, the scan speed of the charged particle beam is determined according to such factors as a material property of the sample, the objective of the observation and the specification of a secondary signal detector.

When the scan speed is high, an integration time of the detection signal is so short that a S/N ratio becomes low while a response to a time-to-time change of a sample is quick and the charged particle beam has a smaller effect on destruction, contamination and charging of the sample because the time for the charged particle beam being radiated on a point on the sample is short.

On the other hand, when the scan speed is low, the integration time of the detection signal is so long that images with the high S/N ratio are obtained while the charged particle beam has a larger effect on destruction, contamination and charging of the sample.

Therefore scanning is usually performed at a high speed while a desired observation area is being searched and at a low speed when the desired observation area is scanned to take and record a high resolution image.

Moreover when such a sample as is easily destructed, contaminated or charged by the charged particle beam being radiated is observed, it is possible to take the high scanning speed to reduce the above mentioned effect. However, there are other countermeasures than taking the high scanning speed, such as setting a lower voltage to an acceleration voltage and reducing an electrical current flowing through the charged particle beam that is radiated on the sample by making a probe diameter of the charged particle beam smaller.

Other factors to determine the scanning speed of the detector than the above mentioned are properties of the detector. That is, the scanning speed of the detector is dependent on a response speed for the secondary signal to be detected by the detector and converted by the detector to an electrical signal and a response speed for the detection signal is processed through an amplification circuit. The larger the gain for the amplification circuit, the slower the response time for the amplification circuit.

If the detector response speed and the amplification circuit response speed are low, the frequency band for the detection signal is restricted while it is being detected and amplified, however fast the charged particle beam is scanned.

When a detection signal which is obtained while a microstructure of the sample is being scanned and has high frequency components is inputted to the detector circuit above mentioned, an impulse response is created and an output signal for a time t for which the impulse response converges becomes a summation of the detection signal and the impulse response.

The image of the output signal above mentioned flows in the direction in which the charged particle beam is scanned and is blurred so much that it is impossible to identify a sample structure. Accordingly it is impossible to observe a sample at a high scan speed with a high gain if a detector whose response speed is relatively low is used.

The detector is selected according to the secondary signal to be detected and such conditions as atmosphere in the sample chamber and detection sensitivity. Therefore, as is the case with the above mentioned, a detector whose response speed is low is used to observe a sample at a relatively low scan speed, depending on the observation condition. However there is a problem that it is hardly possible to make an observation at a high scan speed in order to look for an area in which a point of interest exists or to reduce the damage of the sample in this case.

There is a conventional technology described in WO2003/044821 with which the image deterioration, which occurs due to the charged particle beam being scanned and the secondary signal ejected during the scanning is compensated for making use of the images obtained after plural times of scanning. WO2003/044821 discloses a technology to correct a drift of the observed image with time elapsing, which occurs due to such factors as the change in stability of the charged particle beam, deformation of the sample and a shift of the sample stage. That is, WO2003/044821 discloses a technology to correct the image position by calculating an image shift based on images obtained after plural times of scanning and a technology to improving the S/N ratio of the image by integrating images which are obtained by plural times of high speed scanning and whose image shifts are corrected according to the above mentioned technology. However, looking to deterioration of the images that are obtained by high speed scanning, the waveform of the output signal is not deformed by an amount of output signals or noises included in the output signal, but deformed by the property of the detector. Therefore this deterioration is not prevented by such measures as improving the S/N ratio by integration.

PRIOR ART LITERATURE

Patent Document International Publication Pamphlet WO2003/044821

SUMMARY OF INVENTION

Problem to Be Solved By the Invention

The present invention is intended to improve the charged particle apparatus with a detector having a relatively low response speed, the charged particle apparatus with which observation is performed by amplifying detection signals with a high gain through an amplification circuit. Specifically the present invention is intended to prevent deterioration of output signals outputted from a detector of a charged particle beam apparatus and two dimensional images of the output signals, the deterioration which occurs when the charged particle beam is scanned at a higher speed than an upper limit of the frequency band for the detector and the amplifier.

Measures to Solve the Problem

The charged particle beam apparatus of the present invention records a detected signal obtained at a scan speed of the charged particle beam within a frequency range for the frequency band width and a detected signal obtained at a scan speed of the charged particle beam above the upper limit of the frequency range. The charged particle beam apparatus of the present invention has a signal processing section to apply Fourier transformation to these detected signals, perform division between the Fourier transformed results, calculate a deterioration function, apply inverse Fourier transformation to the inverse function of the deterioration function, and apply to a one-dimensional correction filter amplitude values within a time t for which an impulse response converges. The charged particle beam apparatus of the present invention has a function to apply the one-dimensional correction filter to the detected signal obtained at a scan speed of the charged particle beam above the upper limit of the frequency range or a two-dimensional image based on the detected signal.

The signal processing section may be an image processing device to calculate the deterioration function and make the one-dimensional correction filter by image processing, making use of a still image based on detected signal obtained at a scan speed of the charged particle beam within the frequency range for the frequency band width and the still image based on detected signal obtained at a scan speed of the charged particle beam above the upper limit of the frequency range.

There may be plural scan speeds of the charged particle beam of fixed values and plural gains of fixed values the amplifier on the detector has. In this case, a one-dimensional correction filter to be used is determined in advance on selecting the scan speed and the gain of the amplifier depending on the combination of the selected scan speed and the selected gain of the amplifier, so that a one-dimensional correction filter, which is appropriate for the selected scan speed and the selected gain of the amplifier, is applied to the detection signal or a two-dimensional image based on the detection signal.

Moreover, the charged particle beam apparatus may have plural detectors that are different from each other. In this case, the one-dimensional correction filter to be used is determined in advance on selecting a detector to be used, the scan speed and the gain of the amplifier depending on the combination of the selected detector, the selected scan speed and the selected gain of the amplifier, so that the one-dimensional correction filter is determined, which has appropriate weight coefficients for the selected detector, the selected scan speed and the selected gain of the amplifier.

The one-dimensional correction filter may be prepared the following way when an observation is under way. If there is no micro surface structure on a sample that is appropriate for preparing the one-dimensional correction filter, which means that the whole surface of the sample is flat, it is hardly possible to determine to what extent the detected signal deteriorates and obtain a deterioration function. In this case, a dummy sample having an appropriate micro structure is put on the sample stage. Then the one-dimensional correction filter is prepared by setting the view position and the magnification appropriate for this appropriate micro structure of the dummy sample and subsequently the actual sample is observed with the view position and the magnification set appropriate for the actual sample.

The prepared one-dimensional correction filter may be stored in a storage circuit in which a plurality of the one-dimensional correction filters are to be stored. Accordingly when a one-dimensional correction filter that is prepared in the past is needed, it is recalled from the storage circuit and applied again.

In addition, plural one-dimensional correction filters that are arbitrarily selected may be recalled from the storage circuit and an average of the selected one-dimensional correction filters may be used as a newly prepared one-dimensional correction filter.

Effect of the Invention

The present invention is intended for the charged particle beam apparatus which has a detector having a property of a relatively slow response and with which observation is performed with a detection signal amplified with a high gain and capable of performing a correction at a high speed using a one-dimensional correction filter. As a result, the charged particle beam apparatus of the present invention has an effect of obtaining an image that is taken at a high scan speed and not deteriorated so much as those with the current apparatus and enables high speed scanning for looking for an appropriate view field with the detector and reducing damage on a sample.

Moreover, when a signal is obtained with the charged particle beam being scanned at a high scan speed, a radiation time of the charged particle beam on a unit area on a sample is shorter, which results in a smaller number of secondary electrons being ejected, and a signal integration time is shorter. Accordingly, an S/N ratio of the signal is lower. However the charged particle beam apparatus of the present invention reduces high frequency noises that are generated from a detector at random because the detector and the amplifier restrict a frequency band for the signal to pass and play a role for a low-pass filter. As a result, images obtained through the one-dimensional correction filter of the present invention have a higher S/N ratio even if they are obtained with the charged particle beam at a high scan speed.

EMBODIMENT FOR PRACTICING THE INVENTION

Figure 1:
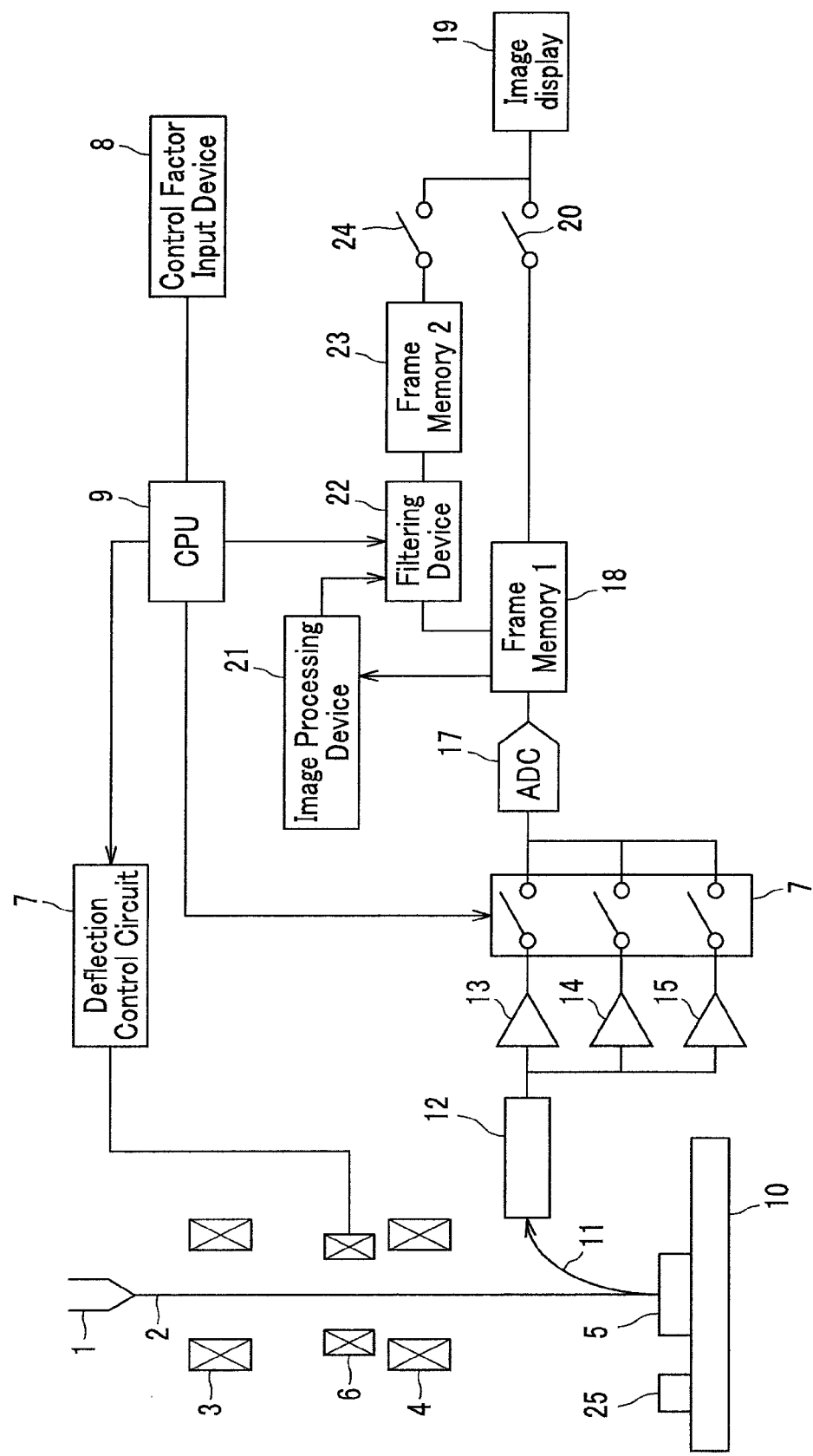
FIG. 1 shows constituent devices to enable a function to practice the present invention.
Figure 2:
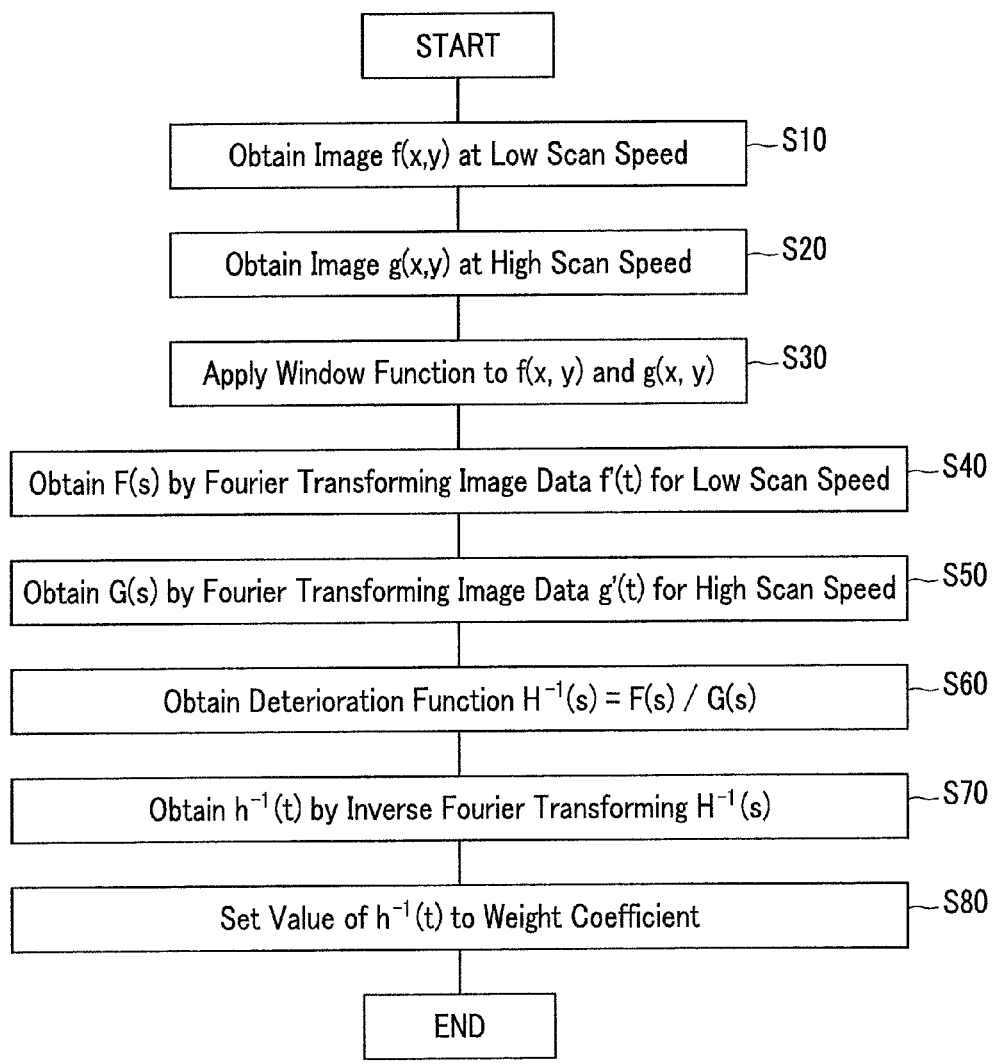
FIG. 2 shows a flow chart to create a deterioration function and a one-dimensional correction filter of the present invention.

Looking to FIG. 1 and FIG. 2, an example of the present invention is explained.

FIG. 1 shows an example of an embodiment on a charged particle apparatus to enable a function to practice the present invention.

Charged particle beam 2 emitted from an electron gun 1 is made by a condenser lens 3 to focus in such a way that a beam diameter of the charged particle beam becomes a minimum on a surface of a sample 5 after passing an objective lens 4. As a deflection current, which is supplied from a deflection control circuit 7 and flows through a deflection coil 6, changes with time elapsing, a magnetic field intensity changes and the charged particle beam 2 is made to scan two-dimensionally in the horizontal and vertical directions. A scanning speed of the charged particle beam 2 may be changed to a plurality of speed levels by changing the change period of the deflection current supplied from the deflection control circuit 7. An operator inputs any scanning speed to CPU 9. CPU 9 instructs the deflection control circuit to change the scanning speed to the input one. A sample stage 10 on which the sample 5 is placed is moved manually or on a motor being driven, which makes the position of the sample 5 shift. As a result, a surface area of the sample 5 on which the charged particle beam 2 is radiated is shifted and an observation area corresponding to the surface area shifts. A secondary signal 11 is ejected from the surface area on which the charged particle beam 2 is radiated, detected by a detector 12 and converted to an electrical signal as a detection signal. This detection signal is amplified through an amplifier 13 to an amplified signal having sufficiently large amplitude. In case the detection signal is very small, there need be a plurality of different amplifiers with different amplification factors some of which has a higher amplification factor than normal or an amplifier whose amplification factor can be varied to any amplification factor.

An example shown in FIG. 1 has three amplifiers including not only the amplifier 13 but also amplifiers 14, 15 whose amplification factors are higher than that of the amplifier 13. The actually used amplifier is chosen by switching a selector 16 to any of the three amplifiers that is required. The number of the amplifiers is determined according to the amplification factors that are required. When an operator inputs an amplification factor to CPU 9 with a control factor input device 8, CPU 9 switches the selector 16 to have an amplifier with the inputted amplification factor connected. The amplified detection signal through the amplifier is converted through an analog-digital converter 17 to a digital signal for a gray scale value in the gray scale image, which corresponds to an intensity of the detection signal. The digital signal for the intensity of the detection signal is stored at horizontal and vertical coordinates of an image data in a frame memory 18 which correspond to scan coordinates in horizontal and vertical directions and output to an image display device 19. As a result, a two dimensional image of a gray scale image for the surface structure of the sample on which the charged particle beam is radiated is observed. The frame memory 18 is connected with the image display device 19 with the switch 20 kept closed. The above mentioned structure is the same as an ordinary charged particle apparatus.

In addition to the above mentioned constituent element, the present invention includes an image processing device 21 that calculates a deterioration function for an image obtained when the charged particle beam 2 is scanned at a higher speed than an upper limit of the frequency band for the detector and the amplifier. The image processing device 21 is connected with the frame memory 18, in which are stored an image recorded at a lower scan speed that is within the frequency band for the detector and the amplifier and another image recorded at a higher scan speed that exceeds the frequency band for the detector and the amplifier. Both one image recorded at a lower scan speed and another image recorded at a higher scan speed have an identical viewing field and recorded through an identical amplifier with the same gain if there are different amplifiers whose amplification factors are different from each other.

The image processing device 21 makes a one-dimensional correction filters from the couple of image data that has been mentioned. The one-dimensional correction filter made by the image processing device 21 is installed at a filtering device 22.

Hereinafter the following applies. If the operator selects through the control factor input device 8 the same scan speed, the same detector amplifier and the same amplifier with the same amplification factor as the higher scan speed used for making the one-dimensional correction filter, one frame of an image is formed in such a way that image data stored in the frame memory 18 are filtered through the one-dimensional correction filter from one horizontal line to the following horizontal line with image data for each horizontal line being filtered at a time and that the corrected data for each horizontal line is stored in a frame memory 23. It is possible to observe an image with reduced image deterioration due to the high speed scanning by displaying data stored in the frame memory 23 on the image display device 19 with the switch 24 kept closed.

Although the image data has to be filtered through the filtering device 22 sequentially at a real time speed commensurate with the scan speed at which the charged particle beam 2 is scanned, a process in which the image processing device 21 calculates a deterioration function and makes the one-dimensional correction filter does not have to proceed so fast as to follow the scan speed at which the charged particle beam 2 is scanned. Accordingly the configuration of the apparatus may be made simplified by having CPU 9 perform a software image processing process to prepare the one-dimensional correction filter of software and having the resultant one-dimensional correction filter installed at the filtering device 22.

The one-dimensional correction filter may be made in advance for every combination of the scan speed of the charged particle beam 2 and the amplification rate of the amplifier with the image processing device 21. When the scan speed of the charged particle beam 2 or an amplification rate of the amplifier is changed through CPU 9 by operator's direction, the one-dimensional correction filter for the combination of the scan speed of the charged particle beam 2 or an amplification rate of the amplifier that are selected with control factor input device 8 is installed at the filtering device 22 and an image after appropriately corrected depending on the scan speed and the amplification rate of the amplifier that are selected is observed.

If there are a plurality of detectors attached to the apparatus, of which response speeds differ from each other, each of the plurality of detectors 12 is connected with amplifiers 13, 14, 15 through the selector 16. In this case there are more selected lines between the detectors and the amplifiers and the one-dimensional correction filter may be made in advance for each combination of the detector, the amplification rate of the amplifier and the scan speed. The one-dimensional correction filter for the selected detector, amplification rate and scan speed is installed at the filtering device 22 through CPU 9.

When it is not possible to calculate a degree of the deterioration from the observed image with no appropriate microstructure on the sample 5 being observed, the sample stage 10 is moved to a position at which the charged particle beam 2 is radiated on a reference sample 25 that is intended to be used for preparing the one-dimensional correction filter. The reference sample 25 should be such a sample as has a surface structure on which a plurality of parallel lines are formed and the charged particle beam 2 is scanned in a vertical direction to the plurality of parallel lines. When the reference sample 25 is used, the one-dimensional correction filter is prepared with the same detector, the same amplification rate of the amplifier and the same scan speed as are to be used for the sample 5 to be actually observed and the prepared one-dimensional correction filter is installed at the filtering device 22 and then the sample stage 10 is moved to a position where the charged particle beam 2 is radiated on the sample 5 to be observed. In this way even if the sample 5 does not have the appropriate micro-structure, an image for the sample 5 after corrected through the appropriate one-dimensional correction filter.

FIG. 2 is a flowchart explaining a process for the image processing device 21 to create a deterioration function and a one-dimensional correction filter of the present invention.

Figure 3A:
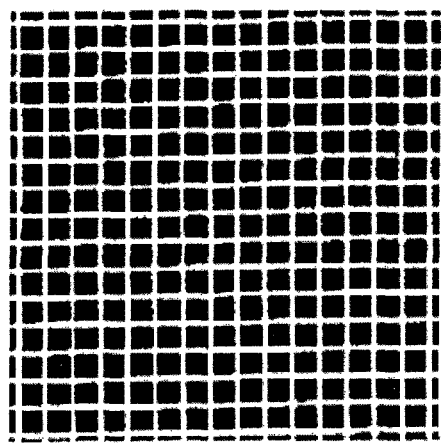
FIG. 3A, 3B, 3C, 3D show photos each of which corresponds to an individual process in the flowchart in FIG. 2.

In order to calculate a deterioration function, firstly the charged particle beam 2 is scanned at such a low scan speed as falls within a frequency band for the detector and the amplifier within which an image without deterioration is observed and an image f(x, y) is obtained in Step S10. For example, looking at FIG. 3A for the image f(x, y) with a grid structure, a shape with horizontal and vertical grids are clearly seen.

Figure 3B:
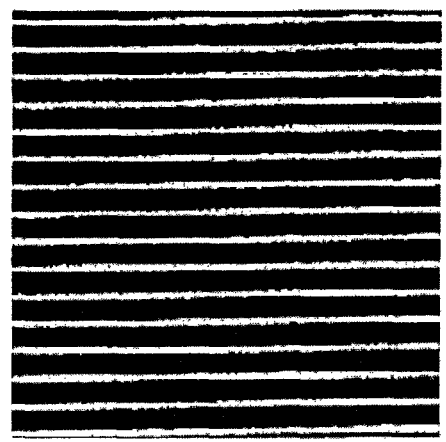

Next, the charged particle beam 2 is scanned on the same view area as for the image f(x, y) at such a high speed as to have deterioration and an image g(x, y) is obtained in Step S20. FIG. 3B shows an image of g(x, y) for the same view area as for that of FIG. 3A. Looking at FIG. 3B, it is noted that the image flows so much in the horizontal X direction corresponding to the scanning direction that the vertical grid structure is not seen.

It should be noted that any of Step S10 and Step S20 may be carried out first because there is no difference, whichever of Step S10 and Step 20 is carried out first.

Figure 3C:
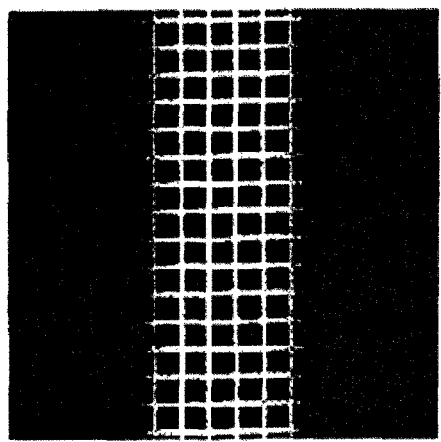
Figure 3D:
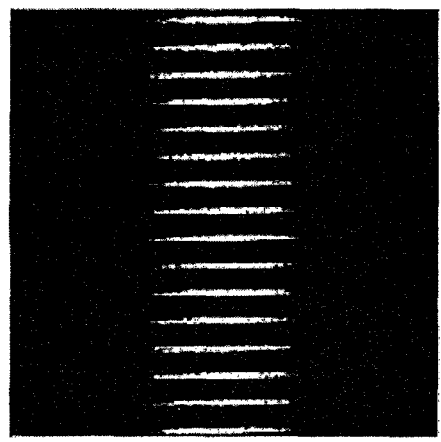

Next, a window function is applied to both images of f(x, y) and g(x, y) and images of f'(x, y) and g'(x, y) are obtained in Step S30. Applying the window function is a general procedure to prevent an artifact resulting from a rapid change at a start point and an end point of a signal from being created when the following Fourier transformation process is performed. In this embodiment, a hanning window is applied to have the signal reduced to 0 at the start point and the end point of the signal and decrease artifacts in the vertical direction in a corrected image after the one-dimensional correction filter is applied. However other window functions than the hanning window may be used. Since the charged particle beam is scanned usually on a line in the horizontal X direction, shifted by one line in the vertical Y direction and scanned in the following line in the horizontal X direction in the two-dimensional scanning process, deterioration due to the high speed scanning occurs in the horizontal X direction in which the charged particle beam moves fast. Therefore this process may be performed to analyze deterioration of the signal only on each line in the horizontal X direction and it is not necessary to apply two-dimensionally the window function process in Step S30 to the image. The window function may be applied only to data for the start point and the end point of the signal in the horizontal X direction. Images in FIG. 3C and FIG. 3D are examples for images obtained after the window function is applied respectively to images in FIG. 3A and FIG. 3B.

Next is performed Step S40, in which Fourier transformation is applied to f'(t) for each line in the horizontal X direction of the image f'(x, y) to obtain F(s).

Next is performed Step S50, in which Fourier transformation is applied to g'(t) for each line in the horizontal X direction of the image g'(x, y) to obtain G(s).

Next is performed Step S60, in which an inverse function $H^{-1}(s)$ to a deterioration function H(s) is obtained according to the following equation 1.

$$H^{-1}(s) = F(s)/G(s) \quad \text{(Equation 1)}$$

Then, a process to prepare a one-dimensional correction filter from the inverse function $H^{-1}(s)$ to the deterioration function H(s) obtained in Step S60 is to be performed. In Step S70, inverse Fourier transformation is applied to $H^{-1}(s)$ to obtain $h^{-1}(t)$. This $h^{-1}(t)$ corresponds to a repair function for a deteriorated image in the real image space. Multiplying $h^{-1}(t)$ with the deteriorated image data g(t) enables repairing the deteriorated image.

In Step S80, the one-dimensional correction filter is prepared by setting amplitude values of $h^{-1}(t)$ until the amplitude value converges on 0 to weight coefficients.

Figure 4:
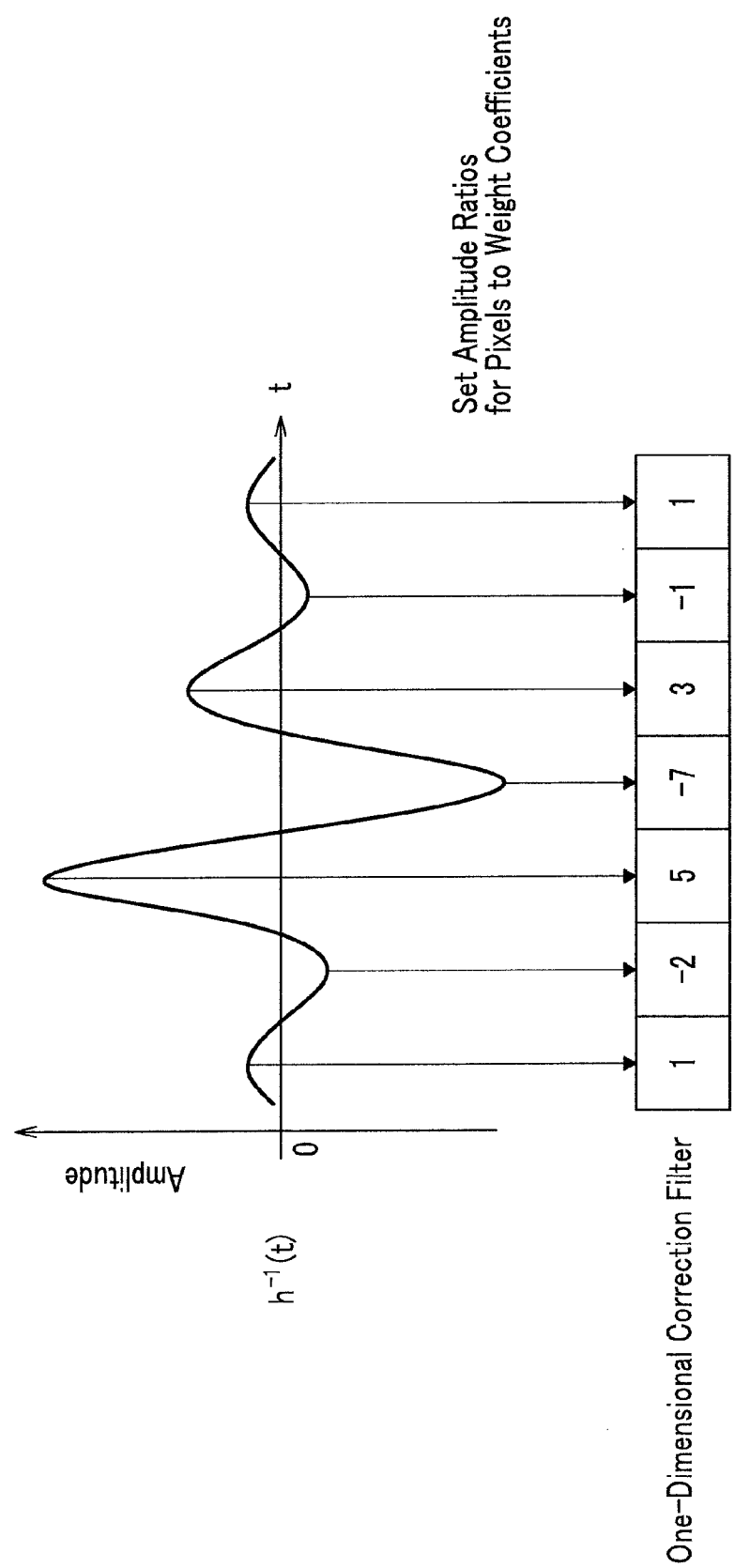
FIG. 4 shows how an inverse function for the deterioration function of the present invention is replaced with the one-dimensional correction filter

FIG. 4 indicates a procedure to prepare the one-dimensional correction filter from $h^{-1}(t)$ in Step S60 in FIG. 2. In FIG. 4, an example for a case in which the amplitude value of $h^{-1}(t)$ converges on 0 within a time t for seven pixels in an image, for instance. The amplitude value at a time t for each pixel relative to the amplitude value of 0 is sampled to an amplitude ratio in such a way that the total of all the amplitude ratios becomes 0 and each of these ratios is set to a weight coefficient for a corresponding pixel. For example, if the amplitude ratios are 1 after $h^{-1}(t)$ for the first pixel is sampled, −2 after $h^{-1}(t)$ for the second pixel is sampled, 5 after $h^{-1}(t)$ for the third pixel is sampled, −7 after $h^{-1}(t)$ for the fourth pixel is sampled is, 3 after $h^{-1}(t)$ for the fifth pixel is sampled, −1 after $h^{-1}(t)$ for the sixth pixel is sampled is −1 and 1 after $h^{-1}(t)$ for the seventh pixel is sampled, the one-dimensional correction filter should become a one-dimensional correction filter for seven pixels having the weight coefficients of 1, −2, 5, −7, 3, −1, 1.

Although the example in FIG. 4 indicates that the amplitude of $h^{-1}(t)$ converges on 0 in the time t which corresponds to seven pixels, the actual number of the pixels of the one-dimensional correction filter for the time t may be any appropriate number depending on to what extent the obtained image degrades. If the time that it takes for the amplitude of $h^{-1}(t)$ to converge on 0 is too long, the operator may set to the time t an appropriate time which is in a range in which the amplitude becomes so small as may be regarded as 0 compared with the maximum amplitude and the minimum amplitude of the $h^{-1}(t)$.

As has been explained, the one-dimensional correction filter can be made from data on any one of the horizontally scanned X direction lines. The frame memory 18 in FIG. 1 stores a two dimensional image obtained by scanning the charged particle beam 2 in the horizontal X direction and vertical Y direction and the number of the data on horizontally scanned X direction lines corresponds to the number of the horizontally scanned lines arranged in the vertical Y direction. Accordingly as many one-dimensional correction filters as the number of the horizontally scanned lines arranged in the vertical Y direction are made from one two-dimensional image and an average of the number of the pixels of the one-dimensional correction filter for the time t are obtained among the horizontally scanned lines arranged in the vertical Y direction. Then this average over the one-dimensional correction filters is applied to the one-dimensional correction filter installed in the filtering device 22. If there is a noise which is due to other cause than the frequency band restriction on the detector and the amplifier and included in any of the image f(x, y) obtained at a relatively low scanning speed and the image of g(x, y) obtained at a relatively high scanning speed when this filtering device 22 is used, the image free from this noise is successfully obtained. Alternatively a comparison on the shape of the one-dimensional correction filter may be made among all of the one-dimensional correction filters for the horizontally scanned lines arranged in the vertical Y direction and those one-dimensional correction filters whose shapes are different from others may be removed in advance. The average of the number of the pixels of the one-dimensional correction filter for the time t may be obtained among the one-dimensional correction filters whose shapes are more or less similar to one another, which contributes to improving the accuracy of the one-dimensional correction filter.

DESCRIPTION OF REFERENCE NUMBER

1 Electron gun
2 Charged particle beam

3 Condenser lens
4 Objective lens
5 Sample
6 Deflection coil
7 Deflection control circuit
8 Control factor input device
9 CPU
10 Sample stage
11 Secondary signal
12 Detector
13 Amplifier 1
14 Amplifier 2
15 Amplifier 3
16 Selector
17 Analog-digital converter
18 Frame memory 1
19 Image display
20 Switch 1
21 Image processing device
22 Filtering device
23 Frame memory 2
24 Switch 2
25 Reference sample for preparing one-dimensional correction filter

The invention claimed is:

1. A scanning electron microscope which is configured to detect a secondary signal ejected by radiating a charged particle beam on a sample, convert the secondary signal to an electrical signal, and amplify the electrical signal through an amplification circuit, the scanning electron microscope having a function to:
obtain a plurality of the secondary signals ejected with a plurality of scan speeds on the charged particle beam that are different from each other,
calculate a deterioration function between the plurality of the secondary signals, and
perform signal processing with a correction filter of an inverse function of the deterioration function,
wherein at least one of the scan speeds is higher than an upper limit of the frequency band for the detector and the amplification circuit.

2. The scanning electron microscope as described in claim 1, further configured to convert the amplitude of the electrical signal to which the secondary signal is converted to a gray scale value of an image data and output the image data through which the secondary signal is observed,
wherein the scanning electron microscope has a function to:
obtain the image data of the plurality of the secondary signals ejected with a plurality of scan speeds on the charged particle beam that are different from each other,
calculate a deterioration function between the plurality of the image data, and
perform image processing with a correction filter of an inverse function of the deterioration function.

3. The scanning electron microscope as described in claim 1, wherein the scanning electron microscope has further a function to alter weight coefficients to be used for a correction process through the correction filter according to the scan speed of the charged particle beam.

4. The scanning electron microscope as described in claim 1, wherein the scanning electron microscope comprises a plurality of detectors which differ from each other in a detection method and has a function to alter weight coefficients to be used for a correction process through the correction filter according to the scan speed of the charged particle beam.

5. The scanning electron microscope as described in claim 1, further configured to amplify the electrical signal by any of a plurality of amplification rates, wherein the scanning electron microscope has a function to alter weight coefficients to be used for a correction process through the correction filter according to the scan speed of the charged particle beam.

6. The scanning electron microscope as described in claim 5, wherein the scanning electron microscope determines any time the weight coefficients to be used for a correction process performed through the correction filter.

7. The scanning electron microscope as described in claim 1, wherein the scanning electron microscope comprises storage means to store a plurality of weight coefficients used for a correction process performed through the correction filter, choose weight coefficients from among the plurality of weight coefficients and perform the correction process with an average value of the chosen weight coefficients, and
wherein at least one of the scan speeds is higher than an upper limit of the frequency band for the detector and the amplification circuit.

8. The scanning electron microscope as described in claim 1, further comprising a sample stage on which a reference sample to be used for preparing the correction filter is placed.

* * * * *